US012721241B2

(12) United States Patent
Park et al.

(10) Patent No.: US 12,721,241 B2
(45) Date of Patent: Aug. 25, 2026

(54) SEMICONDUCTOR PACKAGE

(71) Applicant: SAMSUNG ELECTRONICS CO., LTD., Suwon-si (KR)

(72) Inventors: Sangwook Park, Suwon-si (KR); Sangkyu Kim, Suwon-si (KR); Yoonseok Seo, Suwon-si (KR); Sangnam Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 491 days.

(21) Appl. No.: 18/134,314

(22) Filed: Apr. 13, 2023

(65) Prior Publication Data

US 2024/0055335 A1 Feb. 15, 2024

(30) Foreign Application Priority Data

Aug. 9, 2022 (KR) ........................ 10-2022-0099510

(51) Int. Cl.

| | |
|---|---|
| ***H10W 90/00*** | (2026.01) |
| ***H10B 80/00*** | (2023.01) |
| ***H10W 70/60*** | (2026.01) |
| ***H10W 70/685*** | (2026.01) |
| *H10W 74/15* | (2026.01) |

(52) U.S. Cl.

CPC .......... *H10W 90/701* (2026.01); *H10B 80/00* (2023.02); *H10W 70/611* (2026.01); *H10W 70/685* (2026.01); *H10W 74/15* (2026.01); *H10W 90/724* (2026.01); *H10W 90/734* (2026.01)

(58) Field of Classification Search

None

See application file for complete search history.

(56) References Cited

U.S. PATENT DOCUMENTS

| | | | | |
|---|---|---|---|---|
| 6,724,962 | B2 | 4/2004 | Tsao et al. | |
| 6,867,502 | B2 | 3/2005 | Katagiri et al. | |
| 10,056,321 | B2 | 8/2018 | Kwon et al. | |
| 10,074,632 | B2 * | 9/2018 | Song | H01L 25/0655 |
| 10,224,314 | B2 * | 3/2019 | Jung | H01L 23/49816 |
| 11,133,080 | B2 * | 9/2021 | Park | G11C 29/1201 |
| 2022/0076712 | A1 | 3/2022 | Park et al. | |
| 2022/0328454 | A1 * | 10/2022 | Jang | H01L 25/0655 |

FOREIGN PATENT DOCUMENTS

| | | | |
|---|---|---|---|
| KR | 10-0517608 | B1 | 9/2005 |
| KR | 1020060094917 | A | 8/2006 |
| KR | 1020170006491 | A | 1/2017 |

* cited by examiner

*Primary Examiner* — Long Pham

(74) *Attorney, Agent, or Firm* — Muir Patent Law, PLLC

(57) ABSTRACT

A semiconductor package includes a base substrate, and a first package and a second package mounted apart from each other on an upper surface of the base substrate in a horizontal directions. The second package includes, on each surface thereof, connection pads corresponding to a package ball map including cells, arranged in a plurality of rows and a plurality of columns, each of which has one signal arranged therein. The package ball map includes a first signal, or a data signal, arranged in at least some cells among the cells of the package ball map, and a second signal, or a command or address signal, and the first signal is arranged apart from the second signal.

19 Claims, 8 Drawing Sheets

10

| | A | B | C | D | E | F | G | H |
|---|---|---|---|---|---|---|---|---|
| 1 | DQ | VSS | Diff | Diff | VSS | DQ | VSS | ZQ |
| 2 | VSS | DQ | VSS | VSS | DQ | VSS | CA | VSS |
| 3 | VSS | VSS | Diff | Diff | VSS | DQ | VSS | CA |
| 4 | VSS | DQ | VSS | VSS | DQ | VSS | CA | CA |
| 5 | DQ | VSS | Diff | Diff | VSS | DQ | VSS | CA |
| 6 | VSS | DQ | VSS | VSS | DQ | VSS | CS | CS |
| 7 | DQ | VSS | Diff | Diff | VSS | DQ | VSS | CS |
| 8 | VSS | DQ | VSS | VSS | DQ | VSS | CA | CA |
| 9 | DQ | VSS | Diff | Diff | VSS | DQ | VSS | VSS |
| 10 | VSS | DQ | VSS | VSS | DQ | VSS | DQ | VSS |
| 11 | DQ | VSS | Diff | Diff | VSS | DQ | VSS | DQ |
| 12 | VSS | DQ | VSS | VSS | DQ | VSS | CA | VSS |
| 13 | DQ | VSS | Diff | Diff | VSS | DQ | VSS | CA |
| 14 | VSS | DQ | VSS | VSS | DQ | VSS | CA | CA |
| 15 | DQ | VSS | Diff | Diff | VSS | DQ | VSS | CS |
| 16 | VSS | DQ | VSS | VSS | DQ | VSS | Reset | CS |
| 17 | DQ | VSS | Diff | Diff | VSS | DQ | VSS | CS |
| 18 | VSS | VSS | VSS | VSS | DQ | VSS | CA | CA |
| 19 | DQ | VSS | Diff | Diff | VSS | VSS | VSS | CA |

| | A | B | C | D | E | F | G | H |
|---|---|---|---|---|---|---|---|---|
| 1 | DQ | VSS | Diff | Diff | VSS | DQ | VSS | ZQ |
| 2 | VSS | DQ | VSS | VSS | DQ | VSS | CA | VSS |
| 3 | VSS | VSS | Diff | Diff | VSS | DQ | VSS | CA |
| 4 | VSS | DQ | VSS | VSS | DQ | VSS | CA | CA |
| 5 | DQ | VSS | Diff | Diff | VSS | DQ | VSS | CA |
| 6 | VSS | DQ | VSS | VSS | DQ | VSS | CS | CS |
| 7 | DQ | VSS | Diff | Diff | VSS | DQ | VSS | CS |
| 8 | VSS | DQ | VSS | VSS | DQ | VSS | CA | CA |
| 9 | DQ | VSS | Diff | Diff | VSS | DQ | VSS | VSS |
| 10 | VSS | DQ | VSS | VSS | DQ | VSS | DQ | VSS |
| 11 | DQ | VSS | Diff | Diff | VSS | DQ | VSS | DQ |
| 12 | VSS | DQ | VSS | VSS | DQ | VSS | CA | VSS |
| 13 | DQ | VSS | Diff | Diff | VSS | DQ | VSS | CA |
| 14 | VSS | DQ | VSS | VSS | DQ | VSS | CA | CA |
| 15 | DQ | VSS | Diff | Diff | VSS | DQ | VSS | CS |
| 16 | VSS | DQ | VSS | VSS | DQ | VSS | Reset | CS |
| 17 | DQ | VSS | Diff | Diff | VSS | DQ | VSS | CS |
| 18 | VSS | VSS | VSS | VSS | DQ | VSS | CA | CA |
| 19 | DQ | VSS | Diff | Diff | VSS | VSS | VSS | CA |

| | A | B | C | D | E | F | G | H |
|---|---|---|---|---|---|---|---|---|
| 1 | DQ9 | VSS | Diff | Diff | VSS | DQ8 | VSS | ZQ |
| 2 | VSS | DQ11 | VSS | VSS | DQ10 | VSS | CA6 | VSS |
| 3 | VSS | VSS | Diff | Diff | VSS | DQ11 | VSS | CA5 |
| 4 | VSS | DQ14 | VSS | VSS | DQ12 | VSS | CA3 | CA4 |
| 5 | DQ15 | VSS | Diff | Diff | VSS | DQ13 | VSS | CA2 |
| 6 | VSS | DQ5 | VSS | VSS | DQ6 | VSS | CS0 | CS0 |
| 7 | DQ4 | VSS | Diff | Diff | VSS | DQ7 | VSS | CS1 |
| 8 | VSS | DQ3 | VSS | VSS | DMI0 | VSS | CA1 | CA0 |
| 9 | DQ2 | VSS | Diff | Diff | VSS | DQ1 | VSS | VSS |
| 10 | VSS | DQ9 | VSS | VSS | DQ0 | VSS | ZQ | VSS |
| 11 | DQ10 | VSS | Diff | Diff | VSS | DMI1 | VSS | DQ8 |
| 12 | VSS | DQ11 | VSS | VSS | DQ14 | VSS | DQ6 | VSS |
| 13 | DQ12 | VSS | Diff | Diff | VSS | DQ15 | VSS | CA5 |
| 14 | VSS | DQ13 | VSS | VSS | DQ3 | VSS | CA4 | CA3 |
| 15 | DQ7 | VSS | Diff | Diff | VSS | DMI0 | VSS | CS0 |
| 16 | VSS | DQ6 | VSS | VSS | DQ3 | VSS | Rest_N | CS1 |
| 17 | DQ2 | VSS | Diff | Diff | VSS | DQ0 | VSS | CS0 |
| 18 | VSS | VSS | VSS | VSS | DQ1 | VSS | CA1 | CA2 |
| 19 | DQ4 | VSS | Diff | Diff | VSS | VSS | VSS | CA0 |

FIG. 3

FIG. 5
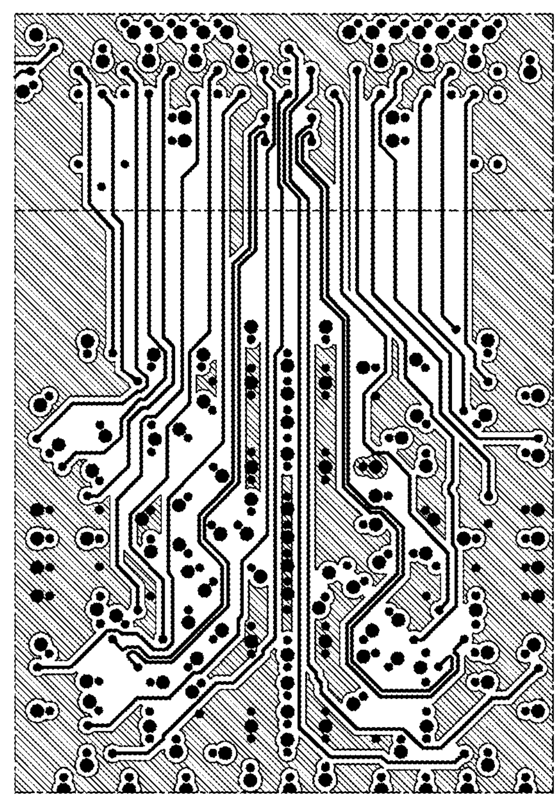
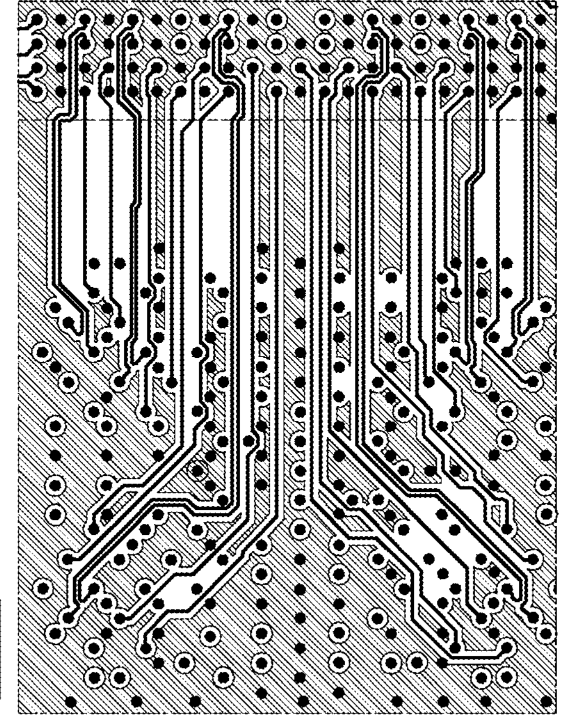

SEMICONDUCTOR PACKAGE

CROSS-REFERENCE TO RELATED APPLICATION

This application is based on and claims priority under 35 U.S.C. § 119 to Korean Patent Application No. 10-2022-0099510, filed on Aug. 9, 2022, in the Korean Intellectual Property Office, the disclosure of which is incorporated by reference herein in its entirety.

BACKGROUND

1. Field

Embodiments relate to a semiconductor package, and more particularly, to routing of a semiconductor package.

2. Description of the Related Art

Semiconductor packages are being developed in a direction that satisfies the needs of multi-functionalization, high capacity, and miniaturization. To this end, a system-in-package has been proposed, which can have high-capacity and be multi-functional while reducing the size of a semiconductor package by integrating multiple semiconductor packages into one semiconductor package.

SUMMARY

According to an aspect of embodiments, there is provided a semiconductor package including a base substrate, and a first package and a second package mounted apart from each other on an upper surface of the base substrate in a horizontal direction, wherein the second package includes, on each surface thereof, connection pads corresponding to a package ball map including cells, arranged in a plurality of rows and a plurality of columns, each of which has one signal arranged therein, wherein the package ball map includes a first signal, or a data signal, arranged in at least some cells among the cells of the package ball map, and a second signal, or a command or address signal, and the first signal is arranged apart from the second signal.

According to another aspect of embodiments, there is provided a semiconductor package including a base substrate, a controller package mounted on an upper surface of the base substrate, and a memory package mounted apart from the controller package on the upper surface of the base substrate in a horizontal direction, wherein the controller package includes, on each surface thereof, a plurality of connection pads corresponding to a package ball map including cells, arranged in a plurality of rows and a plurality of columns, each of which one signal is arranged therein, wherein the package ball map includes a first signal, or a data signal, arranged in at least some cells among a plurality of cells, a second signal, or a command or address signal, and a third signal, or a ground signal, and wherein the first signal is arranged apart from the second signal, and at least one side of a first cell, in which the first signal is arranged, contacts a third cell, in which the third signal is arranged.

According to yet another aspect of embodiments, there is provided a semiconductor package including a base substrate, a first package mounted on an upper surface of the base substrate, and including a first package substrate and a memory chip mounted on the first package substrate, and a second package mounted apart from the first package on the upper surface of the base substrate in a horizontal direction, and including a second package substrate and a controller chip mounted on the second package substrate, wherein the second package includes, on each surface thereof, a plurality of connection pads corresponding to a package ball map including cells, arranged in a plurality of rows and a plurality of columns, each of which one signal is arranged, wherein the package ball map includes first signals, or data signals, arranged in at least some cells among a plurality of cells, second signals, or command or address signals, and third signals, or ground signals, wherein at least one of third cells, in which the third signals are arranged, is arranged between each of first cells, in which the first signals are arranged, and between each of second cells, in which the second signals are arranged, wherein the third cells respectively surround the first cells, and wherein the second package includes first connection pads corresponding to the first signals, second connection pads corresponding to the second signals, and third connection pads corresponding to the third signals.

BRIEF DESCRIPTION OF THE DRAWINGS

Features will become apparent to those of skill in the art by describing in detail exemplary embodiments with reference to the attached drawings, in which:

FIG. 1 is a package ball map indicating an arrangement of signals of a semiconductor package, according to an embodiment;

FIG. 2 is a package ball map indicating an arrangement of signals of a semiconductor package, according to an embodiment;

FIG. 3 is a cross-sectional view of a semiconductor package according to an embodiment;

FIG. 5 is a view of board designs of different base board layers of a base substrate, according to an embodiment;

DETAILED DESCRIPTION

Figure 3:
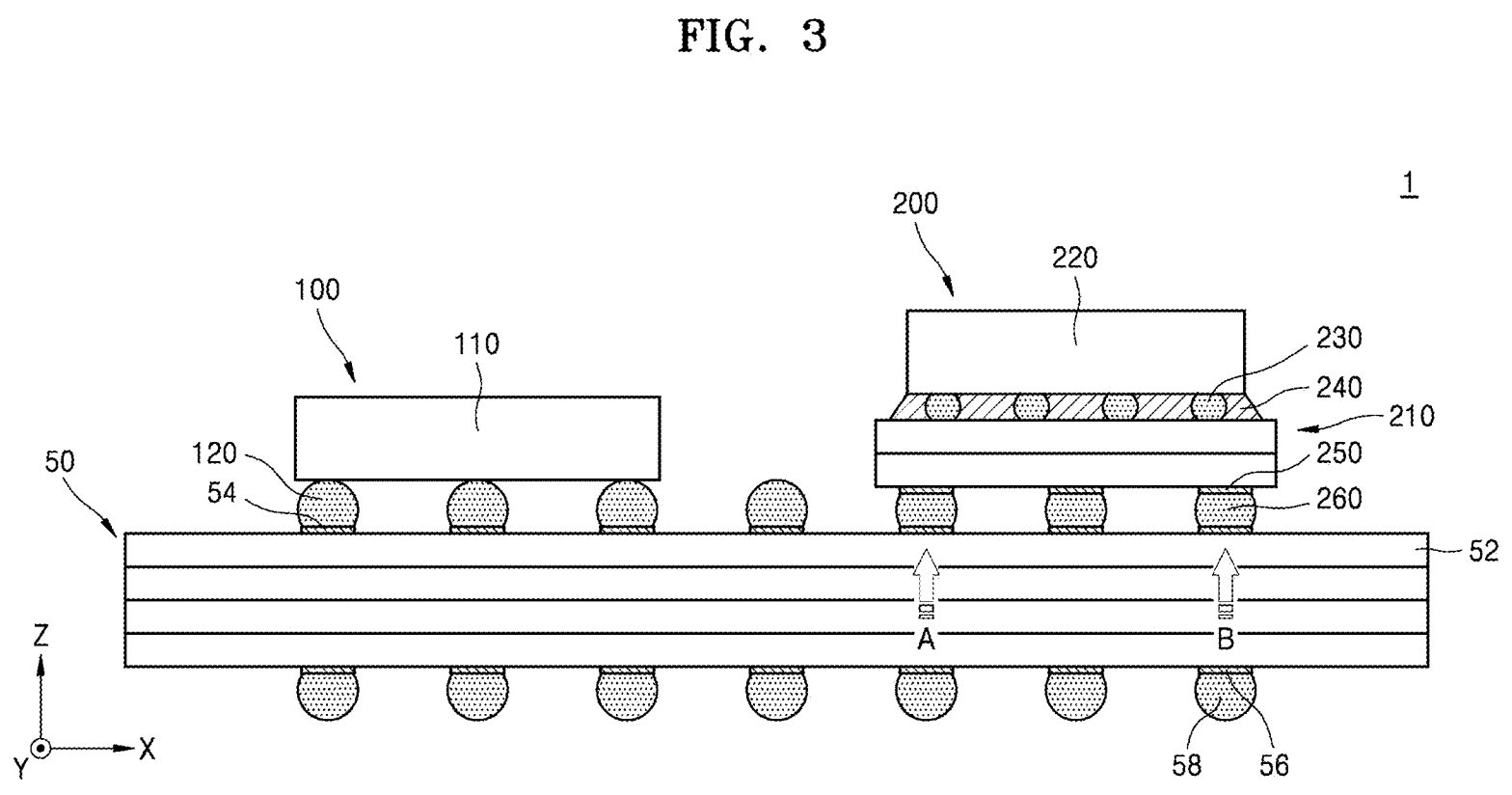
Figure 4:
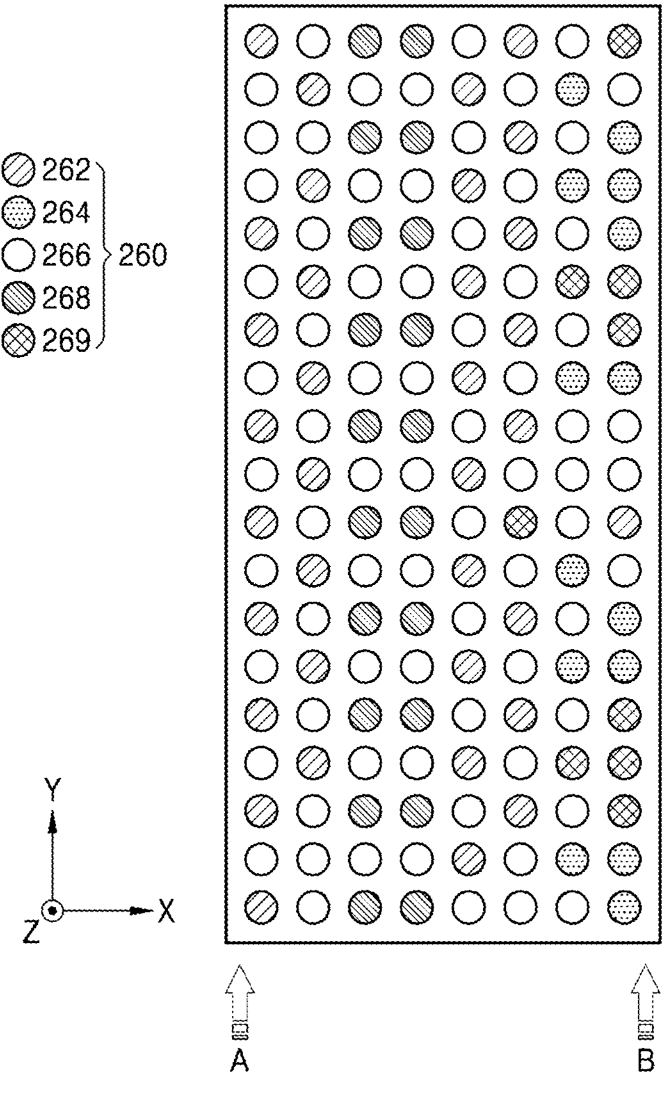
FIG. 4 is an arrangement diagram of a second connection member according to an embodiment.

FIG. 1 is a package ball map 10 indicating an arrangement of signals of a semiconductor package, according to an embodiment. The semiconductor package may include, e.g., a semiconductor package having a controller chip (220 in FIG. 3) for controlling a memory chip (110 in FIG. 3).

The package ball map may include a table, in which signals input/output to/from a semiconductor package are arranged in a table form so that one signal is placed in each cell thereof, and the semiconductor package may have a connection pad for input/output corresponding to the package ball map. A signal may not be arranged in some cells of the package ball map. The arrangement of package ball map and the arrangement of connection pads for input/output may be similar to each other, but because the package ball map summarizes the input/output signals in a table form, the arrangement of package ball map may not exactly match the arrangement of connection pads for input/output, which are actually formed on one side of the semiconductor package.

For example, connection pads for input/output of semiconductor packages for signals arranged in one row or one column of the package ball map may also be formed to be arranged in one row or one column, but are not limited thereto. For example, the spacing or positions between connection pads for input/output of a semiconductor package may vary somewhat considering interference between signals, power supply, or the like, and in this case, the connection pads may also be formed to be distributed without forming rows or columns for signals arranged in some rows or columns of the package ball map. However, overall, two signals arranged in cells relatively close to the package ball map may correspond to two connection pads arranged close to the semiconductor package, and two signals arranged in cells relatively far from the package ball map may correspond to two connection pads arranged somewhat far from the semiconductor package.

Referring to FIG. 1, the package ball map 10 may include cells constituting a plurality of rows, e.g., rows 1 through 19, and a plurality of columns, e.g., columns A through H. In FIG. 1, the package ball map 10 is illustrated to include nineteen rows 1 through 19 and eight columns A through H, but is not limited thereto. For example, the number of rows and/or columns of the package ball map 10 may further increase or decrease depending on the signal arrangement of the semiconductor package indicated by the package ball map 10. Alternatively, the package ball map 10 illustrated in FIG. 1 may include a table, in which signals corresponding to some of the connection pads among all the connection pads included in the semiconductor package are arranged.

A first signal DQ, a second signal CA, a third signal VSS, and a fourth signal Diff may be arranged in the package ball map 10. The first signal DQ, the second signal CA, the third signal VSS, and the fourth signal Diff may be arranged in plural in the package ball map 10. For example, the first signal DQ may include a data signal, and the second signal CA may include a command signal and/or an address signal. For example, the third signal VSS may include a ground signal, and the fourth signal Diff may be a differential signal.

A plurality of third signals VSS arranged in the package ball map 10 may be electrically connected in common. In other words, upper pads (54 in FIG. 3) of a base substrate (50 in FIG. 3), to which each of the connection pads of a semiconductor package (1 of FIG. 3) corresponding to the plurality of third signals VSS is electrically connected, may be electrically connected in common. Accordingly, the connection pads of the semiconductor package (1 of FIG. 3) corresponding to the plurality of third signals VSS may also be electrically connected in common. The plurality of third signals VSS, which are connected in common, may be arranged in the package ball map 10, and may be arranged relatively freely.

Two fourth signals Diff arranged in a pair of adjacent cells in the package ball map 10 may constitute the differential signals. For example, the fourth signal Diff may include a data strobe (DQS) and/or a system clock (CLK). For example, the fourth signals Diff arranged in a pair of cells may be adjacent to each other in the row direction. In addition, in the package ball map 10, in addition to the first signal DQ, the second signal CA, the third signal VSS, and the fourth signal Diff, signals, e.g., data source impedance (ZQ), reset, chip select (CS), and/or data mask inversion (DMI), may be further arranged.

According to an embodiment, the first signal DQ and the second signal CA may be arranged apart from each other. For example, at least one third signal VSS may be arranged between the first signal DQ and the second signal CA. In embodiments, the fact that one signal is apart from another signal means that all sides of a cell, in which the one signal is arranged, do not contact at least one of the sides of the cell in which the other signal is arranged.

For example, all of the first signals DQ may be in contact with at least one third signal VSS. In embodiments, the fact that one signal is in contact with another signal means that at least one side of the sides of a cell, in which the one signal is arranged, is in contact with at least one of the sides of a cell, in which the other signal is arranged. For example, the first signal DQ may be surrounded by the third signal VSS. In embodiments, the fact that one signal is surrounded by another signal means that all sides of a cell, in which the one signal is arranged, are in contact with cells in which the other signal is arranged. However, a case, in which a corner of a cell, in which the one signal is arranged, is in contact with a corner of a cell, in which the other signal is arranged, is excluded.

According to an embodiment, the first signal DQ and the fourth signal Diff, which is arranged in a pair of cells, may be apart from each other. For example, at least one third signal VSS may be arranged between the first signal DQ and the fourth signal Diff, which is arranged in a pair of cells. According to an embodiment, the fourth signal Diff, which is arranged in a pair of cells, may be surrounded by the third signal VSS, e.g., the adjacent cells of the fourth signal Diff may contact each other via one shared common side and may be surrounded together by the third signal VSS.

In addition, according to an embodiment, the second signal CA may not be arranged in at least one column, in which the first signal DQ is arranged, among a plurality of columns. For example, the first signal DQ may be arranged in a first column A, a second column B, a fifth column E, and a sixth column F, but the second signal CA may not be arranged in the first column A, the second column B, the fifth column E, and the sixth column F. In FIG. 1, the second signal CA is illustrated as arranged only in a seventh column G and an eighth column H, but the second signal CA may also be arranged in other columns. In addition, the first signal DQ and/or the second signal CA may not be arranged in a column, in which the fourth signal Diff (in a pair of cells) is arranged.

In general, if the first signal DQ and the second signal CA are not arranged in separate columns, noise may be increased. In addition, if the first signal DQ is not surrounded by the third signal VSS, signal density may be high in some layers of the base substrate, thereby further increasing noise.

In contrast, according to embodiments, the package ball map 10 may increase the signal integrity (SI) and the power integrity (PI) of the semiconductor package (1 of FIG. 3) by arranging the first signal DQ and the second signal CA apart from each other. In addition, the package ball map 10 of the embodiment may increase the SI and the PI of the semiconductor package (1 of FIG. 3) by having the first signal DQ surrounded by the third signal VSS, e.g., as viewed in a plan view, thereby dispersing a signal into various layers of the base substrate 50. In addition, the number of cells in which the third signal VSS is arranged may be increased, thereby increasing the SI and the PI of the semiconductor package.

FIG. 2 is a package ball map 10*a* indicating an arrangement of signals of a semiconductor package, according to an embodiment.

The package ball map 10*a* illustrated in FIG. 2 includes an example, in which particular signals are arranged in the package ball map 10 illustrated in FIG. 1. Accordingly, duplicate descriptions of FIG. 2 with respect to FIG. 1 are omitted.

Referring to FIGS. 1 and 2, the package ball map 10*a* may include cells constituting the plurality of rows 1 through 19 and the plurality of columns A through H. For example, the first signal DQ may be an input/output port of data for 16 bits. Accordingly, the first signal DQ may include DQ0 signal through DQ15 signal. DQ0 signal through DQ15 signal may include an input/output (I/O) port bit 0 signal through an I/O port bit 15 signal, respectively. Accordingly, DQ0 signal through DQ15 signal may be arranged in a cell, in which the first signal DQ of the package ball map 10 of FIG. 1 is arranged.

For example, when the first signal DQ is an I/O port signal of data for 8 bits, the first signal DQ may include I/O port signals having bits 0 through 7. In this case, DQ0 signal through DQ7 signal may be arranged in a cell, in which the first signal DQ is arranged.

FIG. 3 is a cross-sectional view of a semiconductor package according to an embodiment. FIG. 4 is a top view of an arrangement diagram of the second connection member 260 according to an embodiment. In FIGS. 3 and 4, a side A refers to a region in a footprint of a second package 200, which is relatively close to a first package 100 in a first horizontal direction (X direction), and a side B refers to a region in a footprint of the second package 200, which is relatively far from the first package 100 in the first horizontal direction (X direction).

In FIG. 3, only for convenience of illustration, the first connection member 120 and the second connection member 260 are illustrated as being three in number along the first horizontal direction (X direction), respectively. However, embodiments are not limited thereto, e.g., FIG. 4 illustrated the second connection member 260 as being eight in number along the first horizontal direction (X direction).

In embodiments, the first horizontal direction (X direction) may refer to a direction in parallel with a longitudinal direction (longitudinal sides) of a main surface of the base substrate 50, and a second horizontal direction (Y direction) may refer to a direction in parallel with a short side of the main surface of the base substrate 50. A diagonal direction may be defined by combining the first horizontal direction (X direction) component with the second horizontal direction (Y direction) component. A direction vertical to the first and/or second horizontal directions (X and/or Y directions) and to the main surface of the base substrate 50 may be defined as a vertical direction (Z direction).

Referring to FIGS. 1, 3, and 4, a semiconductor package 1 may include the base substrate 50, the first package 100, and the second package 200. The semiconductor package 1 may further include a connection connector for connecting to a host and/or a housing for protecting the base substrate 50, the first package 100, and the second package 200. The second package 200 may include a package, in which connection pads 250 corresponding to the package ball map 10 illustrated in FIG. 1 are arranged on one surface of the second package 200.

For example, the base substrate 50 may include a package substrate, and may include a printed circuit board (PCB) or a ceramic board. For example, the base substrate 50 may include a set board provided in an electronic product.

The base substrate 50 may include a base board layer 52, and an upper pad 54 and a lower pad 56, which are formed on upper and lower surfaces of the substrate base, respectively. The base substrate 50 may include a plurality of wiring paths, which electrically connect a plurality of upper pads 54 to a plurality of lower pads 56, respectively, via the base board layer 52. For example, the base substrate 50 may include a plurality of base board layers 52. For example, the base substrate 50 may include a multi-layer printed circuit board.

The upper pad 54 and the lower pad 56 may be exposed by a solder resist layer covering the upper and lower surfaces of a substrate base, respectively. The substrate base may include at least one of, e.g., phenol resin, epoxy resin, and polyimide. For example, the substrate base may include at least one of frame retardant 4 (FR4), tetrafunctional epoxy, polyphenylene ether, epoxy/polyphenylene oxide, bismaleimide triazine (BT), thermount, cyanate ester, polyimide, and liquid crystal polymer. The upper pad 54 and the lower pad 56 may include, e.g., copper, nickel, stainless steel, or beryllium copper. In the substrate base, an inner wiring for electrically connecting the upper pad 54 to the lower pad 56 (e.g., through an interior of the substrate base) may be formed. The upper pad 54 and the lower pad 56 may include portions, which are exposed by the solder resist layer among circuit wirings patterned after applying a copper foil to the upper and lower surfaces of the substrate base, respectively. The substrate base may include a plurality of base board layers 52, and the base substrate 50 may include layers formed to include a circuit wiring between each of an upper surface and a lower surface of the substrate base and the plurality of base board layers 52. In other words, the base substrate 50 may include a plurality of layers. An internal wiring of the base substrate 50 may include, e.g., a circuit wiring formed in the plurality of layers, a connection wiring connecting between the plurality of layers, etc.

In addition, the base substrate 50 may further include an external connection terminal 58. The external connection terminal 58 may be configured to connect the semiconductor package 1 to a main board of an electronic device, on which the semiconductor package 1 is mounted. The external connection terminal 58 may include a solder ball of a metal material, which includes a conductive material, e.g., at least one of tin (Sn), silver (Ag), copper (Cu), and aluminum (Al).

The first package 100 and the second package 200 may be arranged apart from each other in the first and/or second horizontal directions (X and/or Y directions) on the base substrate 50. For example, the first package 100 may include the memory chip 110, and the second package 200 may include the controller chip 220 controlling the memory chip 110.

The first package 100 and the second package 200 may be electrically connected to each other via the base substrate 50. In other words, a signal output by the first package 100 may be transferred to the second package 200 via a certain wiring line arranged outside or inside the base substrate 50. Similarly, a signal output by the second package 200 may be transferred to the first package 100 via a certain wiring line arranged outside or inside the base substrate 50.

The first package 100 may include the memory chip 110. In other words, the first package 100 may include a memory package. The memory chip 110 may include, e.g., a dynamic random access memory (DRAM).

The memory chip 110 may be electrically connected to the base substrate 50 via the first connection member 120. The first connection member 120 may include, e.g., a solder ball or bump. A lower end of the first connection member 120 may be electrically connected to the upper pad 54 of the base substrate 50.

The second package 200 may include a second package substrate 210 and the controller chip 220 mounted on the second package substrate 210. In other words, the second package 200 may include a controller package. The second package substrate 210 may include, e.g., a PCB. When the second package substrate 210 is a PCB, the second package substrate 210 may include a substrate base, a second package substrate upper pad formed on an upper surface and a lower surface of the substrate base, and a connection pad 250, which is a lower surface pad of the second package substrate 210. Because the basic configuration of the second package substrate 210 is similar to that of the base substrate 50, duplicate descriptions thereof are omitted.

The controller chip 220 may provide a flash interface for the memory chip 110. The controller chip 220 may provide an interface and a protocol between the host and the memory chip 110. In addition, the controller chip 220 may perform wear leveling, garbage collection, bad block management, and error correction code (ECC) on the memory chip 110. For example, the controller chip 220 may include an application processor (AP) chip and/or an image signal processor (ISP) chip.

The controller chip 220 may be electrically connected to the second package substrate 210 via a second connection bump 230. Selectively, an underfill material layer 240 surrounding the second connection bump 230 may be arranged between the controller chip 220 and the second package substrate 210.

The second package 200 may be electrically connected to the base substrate 50 via the second connection member 260. The second connection member 260 may include, e.g., a solder ball or a bump. A lower end of the second connection member 260 may be electrically connected to the upper pad 54 of the base substrate 50, and an upper end of the second connection member 260 may be electrically connected to the connection pad 250 of the second package 200.

The connection pads 250 may include first connection pads corresponding to the first signal DQ, second connection pads corresponding to the second signal CA, third connection pads corresponding to the third signal VSS, and fourth connection pads corresponding to the fourth signal Diff. In other words, the first through fourth connection pads may transmit different signals from each other. In addition, fifth connection pads corresponding to a signal not corresponding to the first through fourth signals DQ, CA, VSS, and Diff may be included. For example, the first connection pads 252 may transmit a data signal used for driving the memory chip 110, and the second connection pads 254 may transmit a command signal and/or an address signal used for driving the memory chip 110. For example, the fifth connection pads 259 may transmit ZQ, Reset, CS, and/or DMI signals.

The second connection members 260 may include first pins 262 electrically connected to the first connection pad, second pins 264 electrically connected to the second connection pad, third pins 266 electrically connected to the third connection pad, fourth pins 268 electrically connected to the fourth connection pad, and fifth pins 269 electrically connected to the fifth connection pads. For example, referring to FIGS. 3 and 4, the first through fifth pins of the second connection member 260 may be arranged in a two-directional array (FIG. 4) between the second package substrate 210 and the base substrate 50 (FIG. 3).

For example, as illustrated in FIG. 4, eight second connection members 260 and nineteen second connection members 260 may be arranged in the first horizontal direction (X direction) and the second horizontal direction (Y direction) on the lower surface of the second package substrate 210, respectively. In another example, the number of second connection members 260 arranged on the lower surface of the second package substrate 210 may be variously changed.

For example, the second connection members 260 arranged on the lower surface of the second package substrate 210 may correspond to, e.g., vertically overlap and be connected to, the connection pads 250 (i.e., the connection pads of FIG. 1) on the lower surface of the second package substrate 210. For example, as illustrated in FIG. 3, the connection pads 250 may be between the lower surface of the second package substrate 210 and corresponding ones of the second connection members 260, e.g., in a one-to-one correspondence.

The first through fourth connection pads may be arranged in plural. For example, the third connection pads may be electrically connected to each other in common. In other words, the upper pads 54 of the base substrate 50 electrically connected to the third connection pads may be electrically connected to each other in common.

According to an embodiment, the first connection pad and the second connection pad may be arranged apart from each other in the first and/or second horizontal directions (X direction and/or Y direction). However, diagonal directions are excluded. For example, at least one third connection pad may be arranged between the first connection pad and the second connection pad.

According to an embodiment, all first connection pads may be adjacent to at least one third connection pad. For example, the first connection pad may be surrounded by the third connection pads. In embodiments, the fact that one connection pad is surrounded by other connection pads means that all connection pads adjacent to the one connection pad in the first and/or second horizontal directions (X direction and/or Y direction) are the other connection pads. However, diagonal directions are excluded.

According to an embodiment, the first connection pad and a pair of fourth connection pads may be arranged apart from each other in the first and/or second horizontal directions (X direction and/or Y direction). For example, at least one third connection pad may be arranged between the first connection pad and the pair of fourth connection pads in the first and/or second horizontal directions (X direction and/or Y direction). However, diagonal directions are excluded. According to an embodiment, the pair of fourth connection pads may be surrounded by the third connection pads.

In addition, according to an embodiment, the first connection pads may be arranged in the second horizontal direction (Y direction). In addition, the pair of fourth connection pads may also be arranged in the second horizontal direction (Y direction). In addition, the first connection pad and the pair of fourth connection pads may be apart from each other in the first horizontal direction (X direction). According to an embodiment, the second connection pad may be arranged adjacent to a side B far from the first package 100 in the first horizontal direction (X direction).

In general, if a first connection pad and a second connection pad were to be arranged adjacent to each other, increased noise could be generated. In addition, if the first connection pad is not surrounded by the third connection pads, signal density could increase in some layers of the base substrate, thereby increasing noise.

In contrast, according to embodiments, the semiconductor package 1 may include a pad arrangement in which the first connection pad and the second connection pad are spaced apart from each other, thereby increasing signal integrity and power integrity of the semiconductor package 1. In addition, in the semiconductor package 1, because the third connection pads surround the first connection pad, signals may be dispersed to various layers of the base substrate 50, thereby further increasing signal integrity and power integrity of the semiconductor package 1. In addition, because the number of third connection pads is increased, signal integrity and power integrity of the semiconductor package 1 may be increased.

FIG. 5 is a view of board designs of different base board layers of a base substrate, according to an embodiment. In detail, FIG. 5 illustrates top (e.g., plan) views of board designs of base board layers A and B (to be stacked to define the base substrate 50 in FIG. 3). A signal line may be electrically connected to, e.g., the memory chip (110 in FIG. 3) and/or the controller chip (220 in FIG. 3), and transmit a signal to the memory chip (110 in FIG. 3) and/or the controller chip (220 in FIG. 3).

For example, if signal lines were to be relatively concentrated in a layer A, and signal lines were to be arranged on the left side of layer B not to be relatively concentrated, but relatively concentrated on the right side of layer B, a board space of the base substrate 50 would not have been used efficiently. Further, the noise of the semiconductor package would have increased.

On the other hand, referring to FIG. 5, when in both layers A and B, according to embodiments, the signal lines are not concentrated, i.e., the signal lines may be uniformly arranged on both the left and right sides of layer B, signal integrity and power integrity of the semiconductor package 1 may be increased. In addition, because the same first signals DQ are connected to each other in different layers, signal integrity and power integrity of the semiconductor package 1 may be increased further.

Hereinafter, an electronic system 900, to which a data receiving device according to embodiments is applied, and an application example thereof are described with reference to FIGS. 6 through 9.

Figure 6:
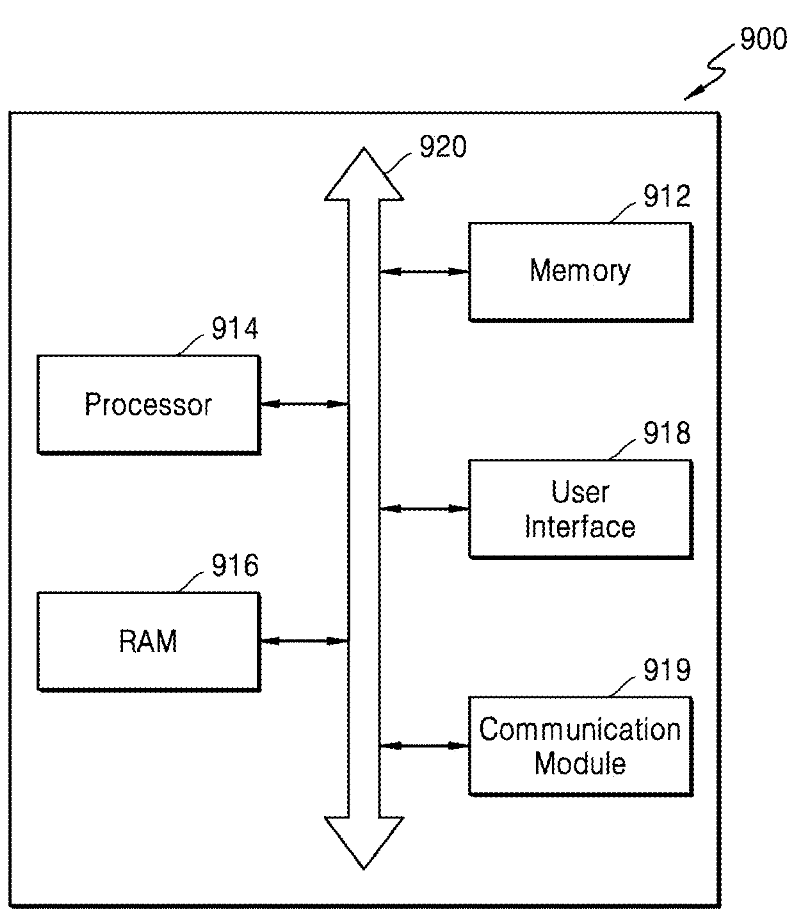
FIG. 6 is a block diagram of an electronic system, to which a semiconductor package is applied, according to an embodiment.
Figure 7:
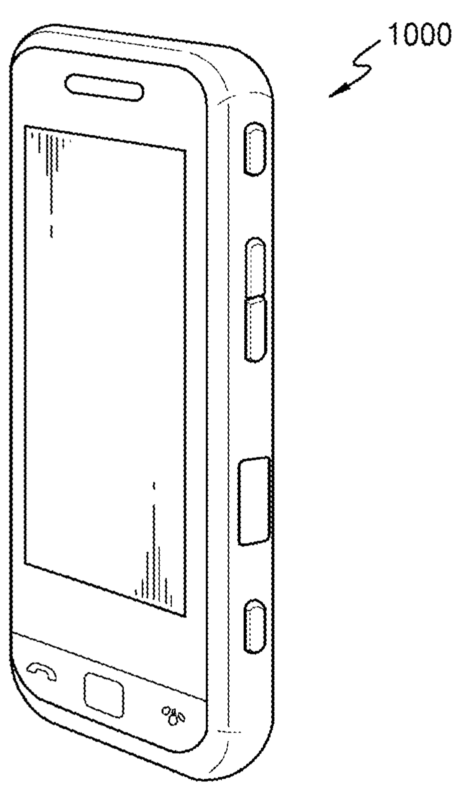
FIG. 7 is a diagram of an example of an electronic device, to which the electronic system of FIG. 6 is applied.
Figure 8:
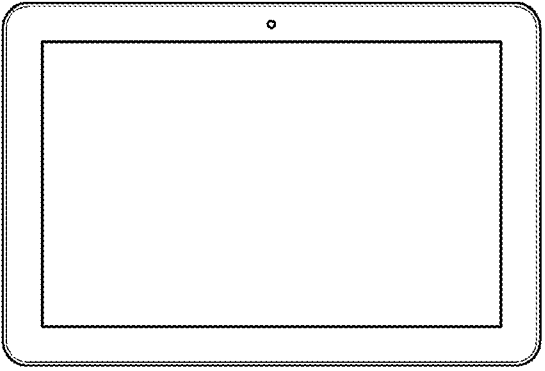
FIG. 8 is a diagram of an example of an electronic device, to which the electronic system of FIG. 6 is applied.
Figure 9:
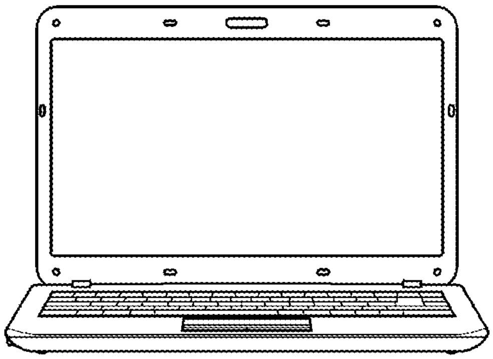
FIG. 9 is a diagram of an example of an electronic device, to which the electronic system of FIG. 6 is applied.

FIG. 6 is a block diagram of the electronic system 900, to which a semiconductor package is applied, according to an embodiment. FIGS. 7 to 9 are diagrams of examples of electronic devices, to which the electronic system 900 of FIG. 6 is applied.

Referring to FIG. 6, the electronic system 900 may include a memory system 912, a processor 914, a random access memory (RAM) 916, a user interface 918, and a communication module 919, which may perform data communication with each other by using a bus 920.

The processor 914 may execute a program, and control the electronic system 900. In addition, the RAM 916 may be used as an operation memory of the processor 914. On the other hand, in some embodiments, the processor 914 and the RAM 916 may be mounted on a set board in the form of a discrete package, and in this case, the processor 914 and the RAM 916 may be mounted in the form of the semiconductor package 1 (FIG. 3).

The user interface 918 may be used to input or output data to or from the electronic system 900.

The memory system 912 may store code for an operation of the processor 914, data processed by the processor 914, or data input from the outside. The memory system 912 may include a controller and a memory device, and the controller may be connected to the bus 920 and the memory device. The controller may be configured to drive firmware for controlling the memory device.

For example, the controller may further include, e.g., internal RAM, an internal processing unit, a host interface, and a memory interface. In this case, the internal RAM may be used as an operation memory of the processing unit. The processing unit may control the overall operation of the controller. The host interface may have a protocol for performing data exchange between the bus 920 and the controller. For example, the controller may be configured to communicate with the outside via at least one of a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and integrated drive electronics (IDE) protocol. The memory interface may interface with the memory device. For example, the memory interface may include a NAND interface or a NOR interface.

The memory system 912 may be configured to additionally include an error correction block. The error correction block may be configured to detect and correct an error of data read from the memory device by using the error correction code ECC.

On the other hand, the controller and the memory device may be integrated into one semiconductor device. As an example, the controller and the memory device may be integrated into one semiconductor device, and constitute a memory card. For example, the controller and the memory device may be integrated into a single semiconductor device, and constitute a memory card, e.g., a personal computer memory card international association, a compact flash (CF) card, a smart media (SM) card (SMC), a memory stick, a multimedia card (MMC), a reduced-size MMC (RS-MMC), an MMC micro, a secure digital (SD) card, a miniSD card, a microSD card, a microSDHC card, and a universal flash storage (UFS) device.

The memory system 912 may be mounted in various types of packages. For example, the memory system 912 may be packaged in a method, e.g., a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system in package (SIP), a multi-chip package (MCP), a wafer-level fabricated package (WFP), and a wafer-level processed stack package (WSP), and may be mounted. The communication module 919 may communicate with the memory system 912, the processor 914, the RAM 916, and the user interface 918 via the bus 920, and the communication module 919 may include a data receiving device according to the embodiments.

The electronic system 900 may be applied to an electronic control device of various electronic devices. FIG. 7 illustrates an example in which the electronic system 900 (FIG. 6) is applied to a mobile phone 1000, FIG. 8 illustrates an example in which the electronic system 900 (FIG. 6) is applied to a tablet PC, and FIG. 9 illustrates an example in which the electronic system 900 (FIG. 6) is applied to a notebook. In addition, the electronic system 900 (FIG. 6) may be applied in various ways to other devices, e.g., a personal digital assistant (PDA), a digital music player, a memory card, a portable mobile terminal having mobile communication functions, etc.

By way of summation and review, it is important to increase signal integrity and/or power integrity of a system-in-package. Therefore, embodiments provide a semiconductor package, in which signal integrity and/or power integrity have been increased by changing transmission sequences of data signals, commands, and/or address signals, ground signals, and differential signals. That is, according to embodiments, signal lines may be arranged such that DQ signals may be isolated from CA signals, while the DQ signals may be adjacent to VSS signals, thereby increasing signal integrity and power integrity of a semiconductor package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:

a base substrate; and a first package and a second package on an upper surface of the base substrate, the first package and the second package being spaced apart from each other in a horizontal direction, wherein the second package includes, on a first surface thereof, connection pads corresponding to a package ball map, the package ball map including cells arranged in a plurality of rows and a plurality of columns, and each of the cells including one signal arranged therein, wherein the package ball map includes first signals, which are data signals, arranged in at least two of the cells of the package ball map, second signals, which are command or address signals, and a third signal, which is a ground signal, wherein the first signals are arranged apart from the second signals, to have one or more other signals arranged therebetween, and wherein the third signal is arranged in the package ball map such that every row of cells of the package ball map includes at least one cell for the third signal and every column of cells of the package ball map includes at least one cell for the third signal.

2. The semiconductor package as claimed in claim 1, wherein the connection pads include first connection pads, the first connection pads corresponding to the first signals and being arranged in the horizontal direction.

3. The semiconductor package as claimed in claim 2, wherein the connection pads further include second connection pads, the second connection pads corresponding to the second signals and being spaced apart from the first connection pads.

4. The semiconductor package as claimed in claim 1, wherein:

the first signals are arranged in first cells of the cells, and the third signal is arranged in third cells of the cells, at least one side of each first cell of the package ball map contacting a third cell.

5. The semiconductor package as claimed in claim 4, wherein:

the second package is arranged on the upper surface of the base substrate, and the connection pads include first connection pads corresponding to the first signals and third connection pads corresponding to the third signal, one of the first connection pads being arranged adjacent to a third connection pad in the horizontal direction.

6. The semiconductor package as claimed in claim 1, wherein the first package includes a memory chip, and the second package includes a controller chip configured to control the memory chip.

7. A semiconductor package, comprising:

a base substrate;

a controller package on an upper surface of the base substrate; and a memory package on the upper surface of the base substrate and spaced apart from the controller package in a horizontal direction, wherein the controller package includes, on a first surface thereof, connection pads corresponding to a package ball map, the package ball map including cells arranged in a plurality of rows and a plurality of columns, and each of the cells including one signal arranged therein, wherein the package ball map includes first signals, which are data signals, arranged in at least two of the cells, a second signal, which is a ground signal, and third signals, which are command or address signals, wherein the first signals are spaced apart from the third signals, and at least one side of a first cell of the cells, in which one of the first signals is arranged, contacts a second cell of the cells, in which the second signal is arranged, and wherein the package ball map includes the first cell, which is surrounded on four sides by four second cells including the second cell and additional second cells.

8. The semiconductor package as claimed in claim 7, wherein:

the connection pads include a first connection pad corresponding to one of the first signals, and a plurality of second connection pads, one of the second connection pads corresponding to the second signal, and in a plan view, the first connection pad is arranged on the first surface of the controller package to be surrounded by the plurality of second connection pads.

9. The semiconductor package as claimed in claim 7, wherein the second cell of the package ball map is between a first cell and a third cell of the cells, in which one of the third signals is arranged.

10. The semiconductor package as claimed in claim 7, wherein:

the package ball map includes a fourth signal, which is a differential signal, the fourth signal is arranged in a pair of fourth cells of the cells, the pair of fourth cells being adjacent to each other, and the first cell is arranged apart from the pair of fourth cells.

11. The semiconductor package as claimed in claim 10, wherein the package ball map includes the second cell between the first cell and the pair of fourth cells.

12. The semiconductor package as claimed in claim 11, wherein the package ball map includes the pair of fourth cells surrounded by the second cell and additional second cells.

13. A semiconductor package, comprising:

a base substrate;

a first package on an upper surface of the base substrate, the first package including a first package substrate and a memory chip on the first package substrate; and a second package on the upper surface of the base substrate and spaced apart from the first package in a horizontal direction, the second package including a second package substrate and a controller chip on the second package substrate, wherein the second package includes, on a first surface thereof, connection pads corresponding to a package ball map, the package ball map including cells arranged in a plurality of rows and a plurality of columns, and each of the cells including one signal therein, wherein the package ball map includes first signals, which are data signals, arranged in at least two of the cells, second signals, which are command or address signals, and third signals, which are ground signals, wherein at least one of third cells, in which the third signals are arranged, is arranged between two first cells, in which the first signals are arranged, and at least one of the third cells is arranged between two second cells, in which the second signals are arranged, wherein at least a portion of the third cells respectively surround at least a portion of the first cells, and wherein the connection pads include first connection pads corresponding to the first signals, second connection pads corresponding to the second signals, and third connection pads corresponding to the third signals.

14. The semiconductor package as claimed in claim 13, wherein:

the second connection pads are arranged on the first surface of the second package, the second connection pads being spaced apart from the first connection pads, and the third connection pads are arranged on the first surface of the second package, the third connection pads being adjacent to the first connection pads.

15. The semiconductor package as claimed in claim 13, wherein:

the plurality of rows in the package ball map extend in the horizontal direction, and at least one of the first signals is arranged in at least one of the plurality of rows that does not include the second signals.

16. The semiconductor package as claimed in claim 13, wherein:

the package ball map includes fourth signals, which are differential signals, the fourth signals being arranged in pairs of fourth cells adjacent to each other, and each of the second cells and each pair of fourth cells in the package ball map are spaced apart from each other.

17. The semiconductor package as claimed in claim 16, wherein:

the second package further includes fourth connection pads corresponding to the fourth signals, and each of the second connection pads and each of the fourth connection pads of the second package are arranged apart from each other.

18. The semiconductor package as claimed in claim 13, wherein the package ball map further includes fifth signals including at least one of data source impedance, reset, chip select, and data mask inversion.

19. The semiconductor package as claimed in claim 13, wherein the memory chip is a dynamic random access memory chip.

* * * * *